US012494339B2

(12) United States Patent
Jiang

(10) Patent No.: US 12,494,339 B2
(45) Date of Patent: Dec. 9, 2025

(54) HIGH RESOLUTION, MULTI-ELECTRON BEAM APPARATUS

(71) Applicant: KLA Corporation, Milpitas, CA (US)

(72) Inventor: Xinrong Jiang, Palo Alto, CA (US)

(73) Assignee: KLA Corporation, Milpitas, CA (US)

( * ) Notice: Subject to any disclaimer, the term of this patent is extended or adjusted under 35 U.S.C. 154(b) by 1112 days.

(21) Appl. No.: 17/412,242

(22) Filed: Aug. 25, 2021

(65) Prior Publication Data

US 2023/0066086 A1 Mar. 2, 2023

(51) Int. Cl.
*H01J 37/12* (2006.01)
*H01J 37/14* (2006.01)

(52) U.S. Cl.
CPC .............. *H01J 37/12* (2013.01); *H01J 37/14* (2013.01); *H01J 2237/0453* (2013.01)

(58) Field of Classification Search
CPC .......... H01J 37/12; H01J 37/14; H01J 37/147; H01J 37/0453; H01J 37/004; H01J 37/047
See application file for complete search history.

(56) References Cited

U.S. PATENT DOCUMENTS 5,045,701 A 9/1991 Goldstein et al.
5,387,793 A 2/1995 Sato et al.
7,312,449 B2 * 12/2007 Nakasuji ............ G01N 23/2251 250/311
8,362,425 B2 1/2013 Han et al.
8,785,879 B1 7/2014 Frosien
10,008,360 B2 6/2018 Li et al.
2002/0130262 A1 9/2002 Nakasuji et al.
2006/0243906 A1 * 11/2006 Fukada ................... H01J 37/28 250/311
2008/0121810 A1 5/2008 Liu et al.
2008/0315090 A1 12/2008 Nakasuji et al.
2012/0049064 A1 * 3/2012 Ren ......................... H01J 37/28 250/396 ML
2012/0217393 A1 * 8/2012 Okai ....................... H01J 37/28 250/310
2014/0264062 A1 9/2014 Adamec
2016/0154176 A1 6/2016 Kawada et al.
2017/0316912 A1 * 11/2017 Zeidler ................. H01J 37/292
2018/0254167 A1 9/2018 Zhao et al.
2020/0371019 A1 11/2020 Makai
2021/0116398 A1 4/2021 Ren et al.

FOREIGN PATENT DOCUMENTS

CN 1138989 C 2/2004
WO 2021053824 A1 3/2021

OTHER PUBLICATIONS

WIPO, International Search Report for International Application No. PCT/US2022/041432, Dec. 6, 2022.

(Continued)

*Primary Examiner* — David E Smith
(74) *Attorney, Agent, or Firm* — Hodgson Russ LLP

(57) ABSTRACT

For an electron beam system, a Wien filter is in the path of the electron beam between a transfer lens and a stage. The system includes a ground electrode between the Wien filter and the stage, a charge control plate between the ground electrode and the stage, and an acceleration electrode between the ground electrode and the charge control plate. The system can be magnetic or electrostatic.

13 Claims, 9 Drawing Sheets

(56) References Cited

OTHER PUBLICATIONS

WIPO, Written Opinion of the International Searching Authority for International Application No. PCT/US2022/041432, Dec. 6, 2022.
Seckold et al., "Fabricating Oxley birhomb prisms: a technique for one-piece construction," Applied Optics, Jun. 15, 1985, vol. 24, No. 12, pp. 1720-1721.
Epo, Extended European Search Report issued for European Patent Application No. 22862053.0, Mar. 13, 2025.
Feinerman et al., "Three-dimensional fabrication of miniature electron optics," Electron Microscopy and Holography, Advances in imaging and electron physics, Apr. 10, 2002, vol. 121, pp. 91-142.
Alamir et al., "A study on effect of current density on magnetic lenses," OPTIK, Jan. 1, 2003, vol. 114, No. 2, pp. 85-88.
Jager et al., "A Combined Objective Lens for Electrons and lons," Microelectronic Engineering, Jan. 1, 1996, vol. 30, No. 1/04, pp. 427-430.
EPO, Extended European Search Report issued in European Application No. 22862053.0, Jul. 10, 2025.

* cited by examiner

HIGH RESOLUTION, MULTI-ELECTRON BEAM APPARATUS

FIELD OF THE DISCLOSURE

This disclosure relates to electron beam systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

Electron beam systems can be used for inspections. Previously, an electron source (e.g., a thermal field emission or cold field emission source) emitted electrons from an emitter tip, and then the electrons were focused by a gun lens (GL) into a large size electron beam. The electron beam bearing high beam currents was collimated by the gun lens into a telecentric beam to illuminate a micro aperture array (μAA). The number of apertures in the micro aperture array would determine the number of beamlets. The holes of the micro aperture array could distributed in the shape of a hexagon.

The beam limiting aperture (BLA) following the gun lens was used to select the total beam current in illuminating the aperture array, and the micro aperture array was used to select the beam current for each single beamlet. A micro lens array (MLA) was deployed to focus each beamlet onto an intermediate image plane (IIP). A micro lens (μL) could be a magnetic lens or electrostatic lens. A magnetic micro lens may be a number of magnetic pole pieces powered by coil excitations or permanent magnets. An electrostatic micro lens may be an electrostatic Einzel lens or an electrostatic accelerating/decelerating unipotential lens.

For inspecting and reviewing a wafer, the secondary electrons (SE) and/or back-scatted electrons (BSE) emitted from the wafer due to the bombardments of each primary beamlet electrons may be split from the optical axis and deflected towards a detection system by a Wien filter.

The total multi-beam (MB) number ($MB_{tot}$) may be scaled by the following Equation 1.

$$MB_{tot} = \frac{1}{4}\left(1 + 3M_x^2\right) \tag{1}$$

$M_x$ is the number of all beamlets in the x-axis. For instance, within five rings of hexagon-distributed beamlets, the number of all beamlets in x-axis is $M_x=11$, giving the number of total beamlets $MB_{tot}=91$. Within the 10 rings, the $M_x=21$, and $MB_{tot}=331$.

The throughput of a multi-electron beam apparatus for wafer inspection and review tends to be limited by the number of the beamlets ($MB_{tot}$). The resolution of each beamlet may be gated by the beam crossover (xo) in the projection optics because strong Coulomb interactions between the high-density electrons around the crossover region inevitably generate optical blurs. The more the beamlets (i.e., the higher the total beam currents), the worse each beamlet resolution will be. This reflects the effect of Coulomb interactions between electrons on a multi-beam resolution. Thus, the resolutions of a multi-electron beam system can be limited by the projection optics from the intermediate image plane to wafer.

The throughput of a multi-electron beam apparatus is characterized by the number of sub-beams, or the number of total electron beamlets. The larger the beamlet number, the higher the throughput. However, increasing the number of beamlets may be limited by the resolution of the beamlets. Generally, the more beamlets (or the higher the total beam currents) in a multi-electron beam apparatus, the worse the resolution of each beamlet will be. All the beamlets (or all the total beam current electrons) may optically meet to form a beam "crossover" where strong Coulomb interactions between electrons take place and degrade the beamlet resolutions. The crossover (xo) is where beamlet current meet, which causes the Coulomb interactions between electrons. Physically, there exists a statistical deflection of the electrons, given by the following Equation 2.

$$\Delta\alpha_{xo} \sim \frac{BC^{2/3}}{\theta^{4/3} \times BE_{xo}^{4/3}} \tag{2}$$

$\Delta\alpha_{xo}$ is the angle of the statistical deflection in the crossover plane, BC is the total beam current, $BE_{xo}$ is the beam energy around the crossover, and θ is the crossover angle. The statistical deflection due to Coulomb interactions between electrons optically generates a beam spot blur at wafer, ΔSS, can be provided using the following Equation 3.

$$\Delta SS \sim f \times \Delta\alpha_{xo} \quad (3)$$

f is the focus length (or image distance) in the image side (the wafer side) of the objective lens.

Improved systems and techniques are needed to address these drawbacks and limitations.

BRIEF SUMMARY OF THE DISCLOSURE

A system is provided in a first embodiment. A transfer lens is disposed in a path of an electron beam downstream of an intermediate image plane. A stage is disposed in the path of the electron beam. The stage is configured to hold a wafer. A Wien filter is disposed in the path of the electron beam between the transfer lens and the stage. A ground electrode is disposed in the path of the electron beam between the Wien filter and the stage. A charge control plate is disposed in the path of the electron beam between the ground electrode and the stage. An acceleration electrode is disposed in the path of the electron beam between the ground electrode and the charge control plate.

The system can further include an objective lens disposed in the path of the electron beam downstream of the transfer lens. The objective lens includes an upper pole piece more proximate the transfer lens and a lower pole piece more proximate the stage. The upper pole piece defines a first aperture that the electron beam is directed through. The second pole piece defines a second aperture that the electron beam is directed through. The charge control plate is disposed in the second aperture. The ground electrode is disposed in the first aperture. The objective lens may be a magnetic objective lens in this instance.

The objective lens also can be an electrostatic objective lens.

The acceleration electrode can be spaced from the ground electrode by a first distance and spaced from the charge control plate by a second distance. The first distance can be from 15 mm to 20 mm and the second distance can be from approximately 20 mm to 25 mm.

The acceleration electrode can have a thickness from 12 mm to 16 mm in a direction of the path of the electron beam.

The acceleration electrode can define a bore that the electron beam passes through. The bore can have a diameter from 15 mm to 25 mm.

The system can further include a hexagon detector array.

A method is provided in a second embodiment. The method includes generating an electron beam. The electron beam is directed through a transfer lens positioned downstream of an intermediate image plane, a Wien filter positioned downstream of the transfer lens, a ground electrode positioned downstream of the Wien filter, an acceleration electrode disposed downstream of the ground electrode, and a charge control plate positioned downstream of the acceleration electrode. The electron beam is directed at a wafer on a stage positioned downstream of the charge control plate.

The method can further include directing the electron beam through an objective lens positioned downstream of the transfer lens. The objective lens includes an upper pole piece more proximate the transfer lens and a lower pole piece more proximate the stage. The upper pole piece defines a first aperture that the electron beam is directed through. The second pole piece defines a second aperture that the electron beam is directed through. The charge control plate can be disposed in the second aperture and the ground electrode can be disposed in the first aperture.

The objective lens can be configured to focus the electron beam on the wafer.

The electron beam can be directed through a crossover with a second electron beam. The crossover can be posted at an image distance from the objective lens.

The method can further include selecting a location for a principal plane of the objective lens relative to the wafer to increase resolution.

An acceleration voltage applied to the acceleration electrode can be configured to increase a beam energy around a beam crossover.

The method can further include selecting a crossover beam energy for the electron beam configured to reduce Coulomb interaction effects.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Electron beams can be used for wafer inspection and review, such as to examine finished or unfinished integrated circuit components in nanometer critical dimension (CD) levels. The throughput of a single electron beam apparatus is fairly low, so multi-electron beam systems can be used to raise throughput. As crossovers can reduce resolution, improving multi-beam resolutions (e.g., reducing the statistical blur ΔSS) can be achieved by raising the beam energy around the crossover ($BE_{xo}$) and narrowing the objective lens image distance (f) between the objective lens and the wafer, while keeping the total beam current and crossover angle θ unchanged. The crossover angle θ reflects the beamlet distributions and spacing between beamlets.

Figure 1:
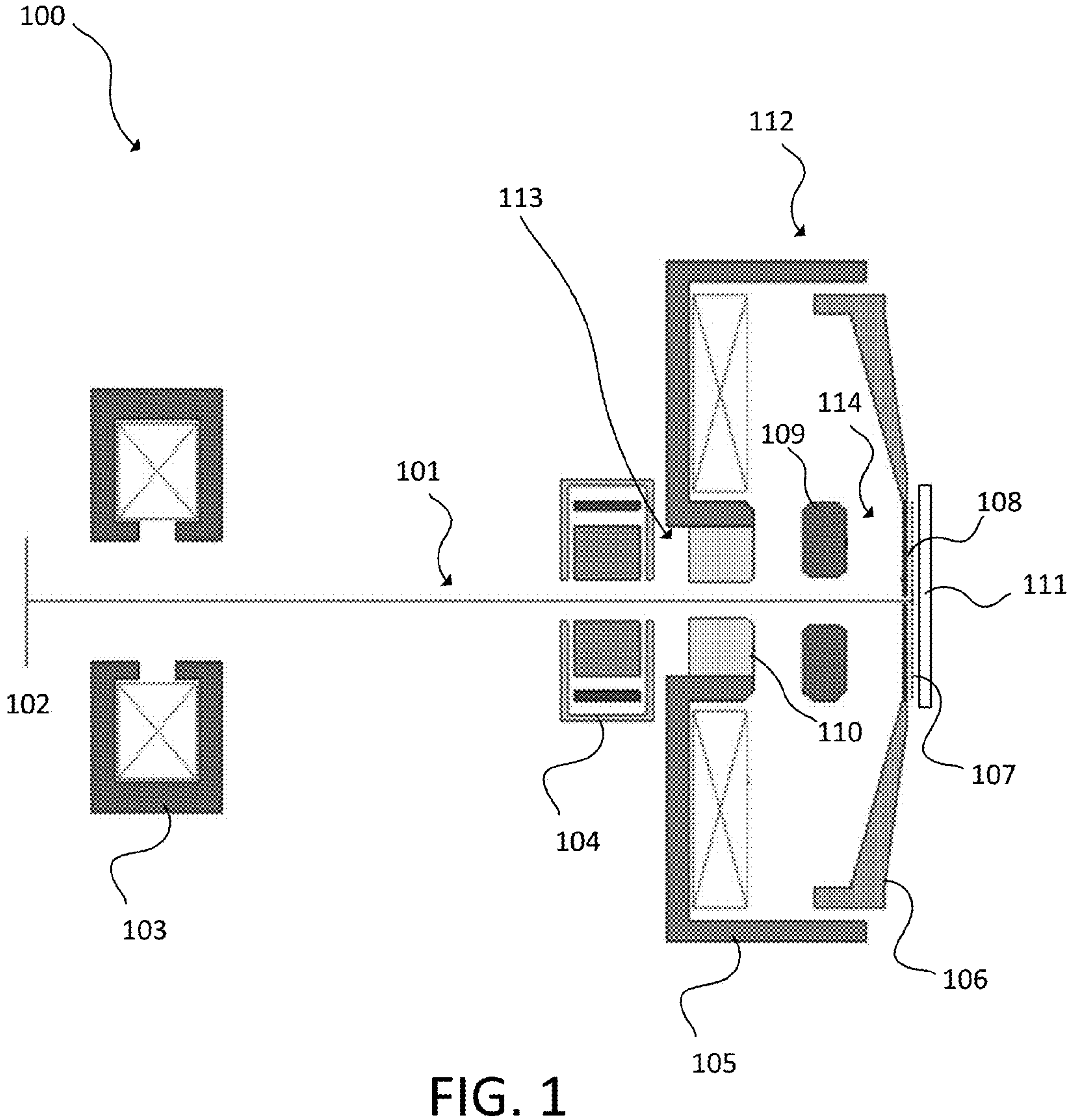
FIG. 1 is a first embodiment of a system using a magnetic accelerating objective lens.

FIG. 1 is a first embodiment of a system 100. An electron source generates the electron beam 101. While a single electron beam 101 is illustrated, more than one electron beam can pass through the system 100. With multiple electron beams, there may be a crossover between the intermediate image plane 102 and the stage 111, such as between Wien filter 104 and the objective lens 112 or in the objective lens 112. The objective lens 112 is designed as an acceleration objective lens by including an acceleration electrode 109 between the ground electrode 110 and charge control plate 108. The acceleration electrode 109 can function as a focusing electrode. The acceleration electrode 109 is applied with an acceleration voltage ($V_a$) for raising the beam energy (BE) around the beam crossover and positioning the objective lens 112 closer to the wafer 107 optically (i.e., narrowing the objective lens 112 image distance f).

The system 100 includes a transfer lens 103 in a path of the electron beam 101 downstream of an intermediate image plane 102. An electron beam source is positioned upstream of the intermediate image plane 102. A stage 111 is configured to hold a wafer 107 in a path of the electron beam 101.

The transfer lens 103 can be an electrostatic lens or magnetic lens. The transfer lens 103 is used to focus the multi-beams to form a crossover around the acceleration electrode in FIG. 1. A magnetic transfer lens 103 may provide improved results with reduced off-axis optical blurs in the multi-beam projection optics compared to an electrostatic transfer lens 103, but either type of transfer lens can be used in system 100.

A Wien filter 104 is disposed in the path of the electron beam 101 between the transfer lens 103 and the stage 111. In an instance, the Wien filter 104 is an EXB Wien filter (i.e., the electrostatic deflection field is perpendicular to the magnetic deflection field). To form uniform deflection fields in a large area for large size multi-beams, the electrostatic and magnetic deflection fields can all be generated with octupole deflectors. The inner diameter and height of the octupoles may be around 48 mm to 80 mm. The Wein filter strength (voltage and current) can be selected to deflect the secondary electrons from approximately 10 to 20 degrees.

A detector (not illustrated) can be positioned upstream of the Wien filter 104 along the path of the electron beam 101. For example the detector may be between the Wien filter 104 and the transfer lens 103. The detector also may be positioned upstream of the transfer lens along the path of the electron beam 101.

A ground electrode 110 is disposed in the path of the electron beam 101 between the Wien filter 104 and the stage 111. The ground electrode 110 can be a holder for other components, such as pole pieces or the Wien filter 104. The ground electrode 110 also can be used as a reference for aligning other components. Optically, the ground electrode 110 can be a boundary for the electrostatic field.

A charge control plate (CCP) 108 is disposed in the path of the electron beam 101 between the ground electrode 110 and the stage 111. The charge control plate 108 can be a thin, conductive plate. In an instance, the charge control plate 108 is approximately 1 mm in thickness with a bore diameter from approximately 1 mm to 5 mm. The charge control plate 108 can form an electrically-extracting field at the surface of the wafer 107. The field can be, for example, from 0 V/mm to 2000 V/mm.

An acceleration electrode 109 is disposed in the path of the electron beam 101 between the ground electrode 110 and the charge control plate 108.

In the instance of FIG. 1, the objective lens 112 is a magnetic objective lens. The system 100 also can include the objective lens 112 disposed in the path of the electron beam 101 downstream of the transfer lens 103. The objective lens 112 includes an upper pole piece 105 more proximate the transfer lens 103 and a lower pole piece 106 more proximate the stage 111. The upper pole piece 105 defines a first aperture 113 that the electron beam 101 is directed through. The second pole piece 106 defines a second aperture 114 that the electron beam 101 is directed through.

The objective lens 112 can include a magnetic section and an electrostatic section. The magnetic section includes the upper pole piece 105 and lower pole piece 106. The upper pole piece 105 and lower pole piece 106 can be sealed or can provide reduced gas flow using, for example, the charge control plate 108 and the ground electrode 110.

As shown in FIG. 1, the charge control plate 108 is disposed in the second aperture 114. The ground electrode 110 is disposed in the first aperture 113. In an instance, the charge control plate 108 is in contact with the lower pole piece 113 and the ground electrode 110 is in contact with the upper pole piece 105.

Figure 2:
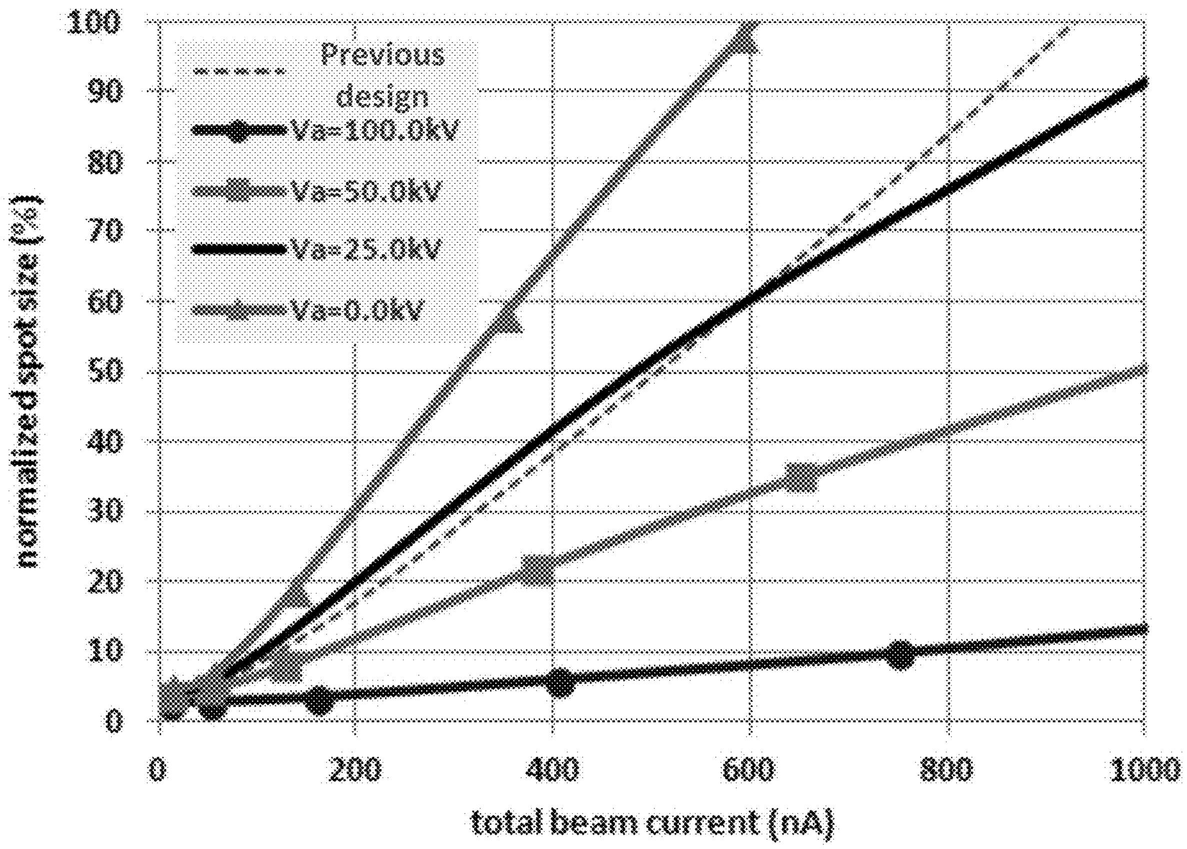
FIG. 2 is a chart showing resolution improvement with acceleration voltages.

FIG. 2 shows the spot size simulations. The acceleration voltage $V_a$ is applied with 0, 25, 50 and 100 kV in simulations, respectively. For each acceleration voltage $V_a$, the magnetic excitation (the coil current) of the objective lens is used to focus the beam on wafer. The crossover (xo) is set around the accelerating electrode ($V_a$) for raising the beam energy around the crossover up to ($BE+V_a$), where the BE is the beam energy in column before the electrons are accelerated.

At the same total beam current in FIG. 2, the spot size decreases with the increase of acceleration voltage, reflecting application of Equations 2 and 3. According to FIG. 2, the beamlet resolutions improve with an increase of the accelerating voltage $V_a$.

With the magnetic accelerating objective lens 112 in FIG. 1, the larger the acceleration voltage $V_a$, the smaller the magnetic excitation used or the closer the combined electrostatic/magnetic lens can be moved to the wafer 107 with shorter image distance f. A smaller Coulomb interaction blur ΔSS will occur according to Equations 2 and 3 and improved results can be achieved.

Figure 3:
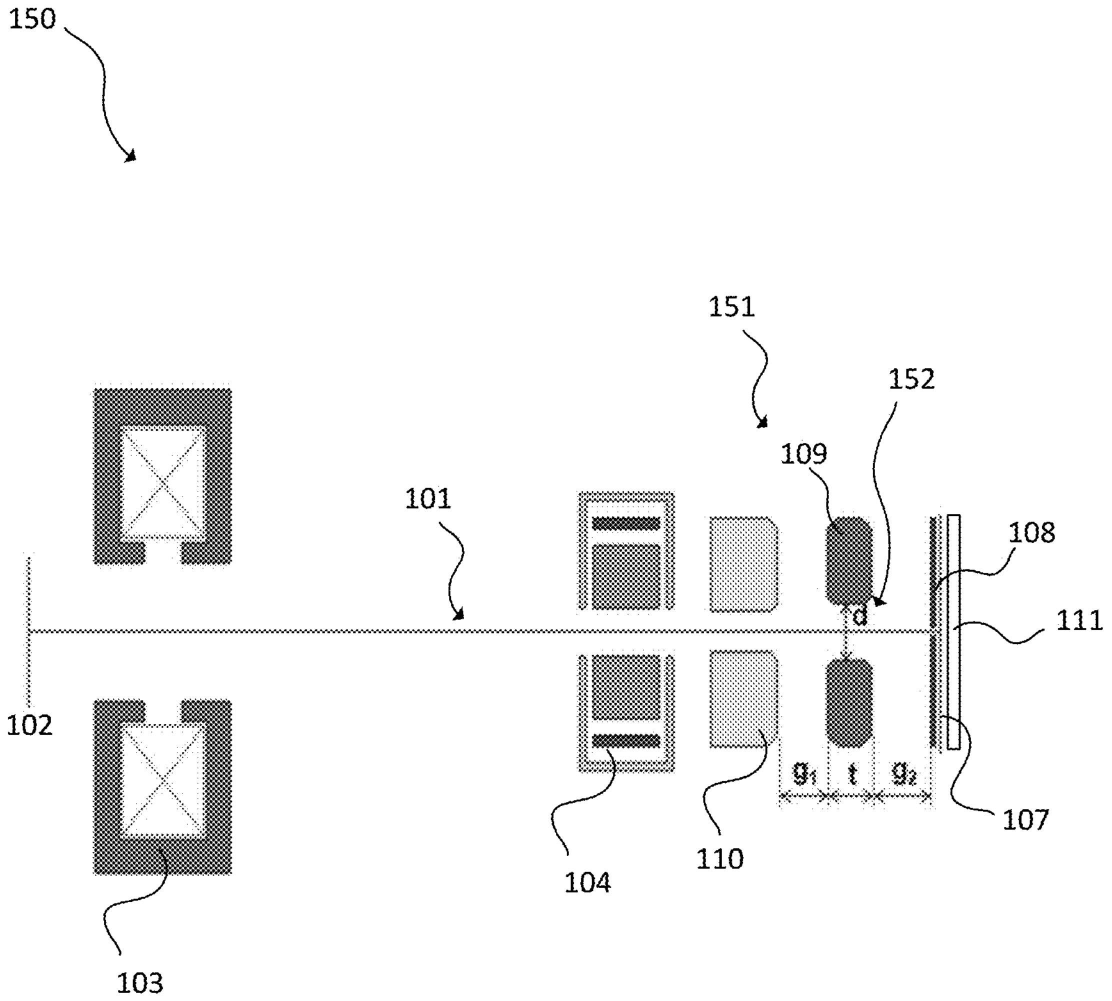
FIG. 3 is a second embodiment of a system using an electrostatic accelerating objective lens.

FIG. 3 is a second embodiment of a system 150. The objective lens 151 is an electrostatic objective lens. In certain instances, the system 150 can provide better beamlet resolutions than the system 100.

Figure 5:
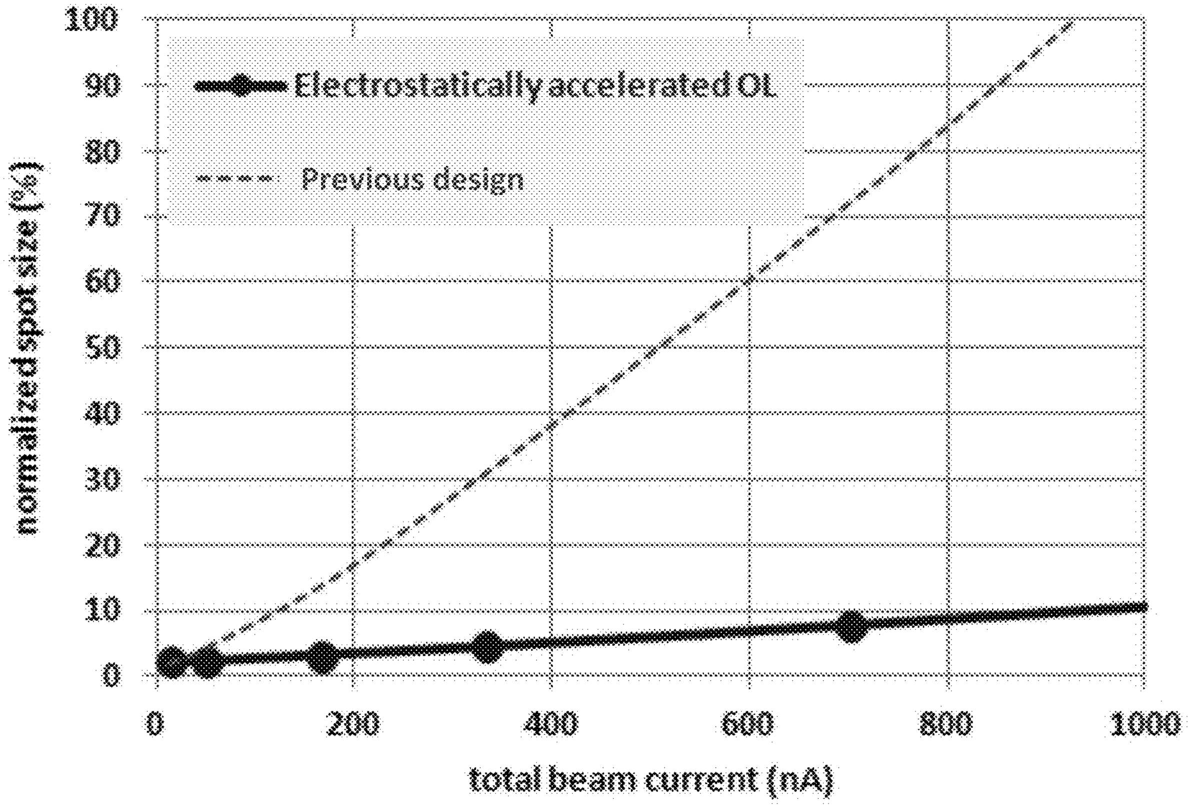
FIG. 5 is a chart showing performance using the embodiment of FIG. 3.

Referring to FIG. 2 and FIG. 5, the magnetic system may provide improved results for medium resolution with $V_a$<50 kV and the electrostatic system may provide improved results for high resolution with $V_a$>50 kV. In FIG. 1, the arcing around pole pieces may occur if $V_a$ is too high (e.g., $V_a$>50 kV). The crossover is typically around the $V_a$ electrode, and each beamlet resolution is mainly degraded by the Coulomb interactions around the crossover. Increasing $V_a$ can improve the resolution. In FIG. 2 and FIG. 5, the portion of the spot size increase with beam current is mostly due to the Coulomb interactions. Without the Coulomb interactions, FIG. 2 and FIG. 5 would be flat over the beam current range. Thus, a location for a principal plane of the objective lens relative to the wafer can be selected to increase resolution. The $V_a$ can be selected to increase beam energy around a beam crossover.

Turning back to FIG. 3, the acceleration electrode 109 is spaced from the ground electrode 110 by a distance g1 in a direction of the path of the electron beam 101. The acceleration electrode 109 is spaced from the charge control plate 108 by a distance g2 in a direction of the path of the electron beam 101. The acceleration electrode 109 has a thickness tin a direction of the path of the electron beam 101. The acceleration electrode 109 also defines a bore 152 that the electron beam 101 passes through. The bore 152 has a diameter d. The distance g1 and g2, diameter d, and thickness t can be configured to avoid arcing.

Removal of the magnetic accelerating objective lens 112 can simplify the design. The system 150 can combine an electron accelerating function for high $BE_{xo}$ and a focusing function for imaging the electron beam 101 on the wafer 107. Use of an electrostatic objective lens can maintain the wafer charging function with the charge control plate, enable the electrons to land on the wafer 107 with desired energies, and can move the lens principal plane closer to the wafer 107, which can provide a fairly short image distance (or focal length) f.

Figure 4:
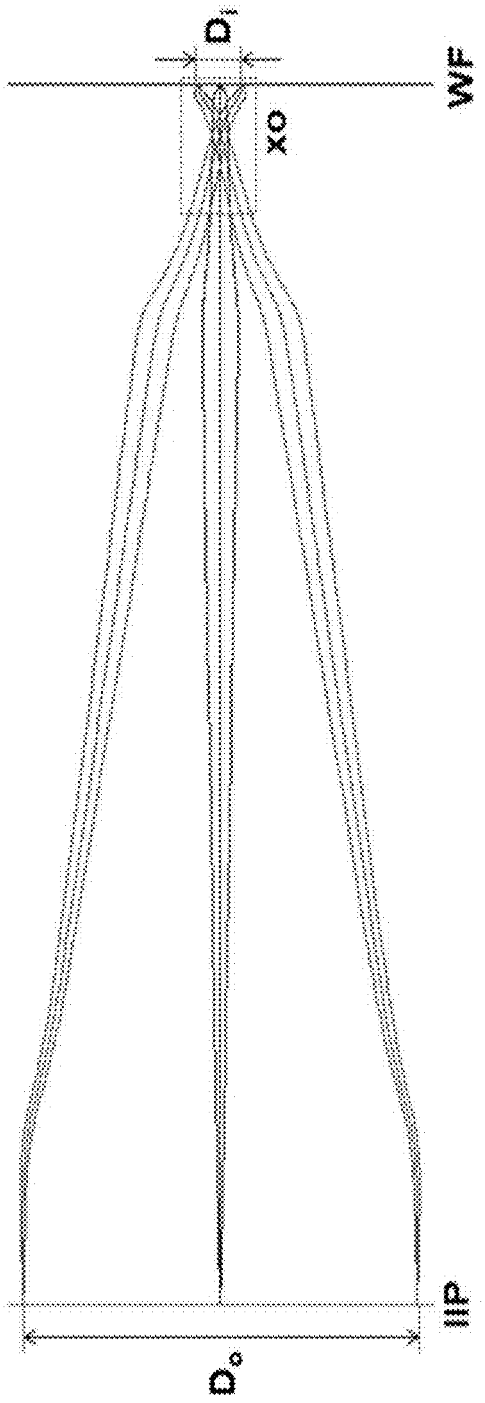
FIG. 4 shows ray-tracing simulations showing a multi-beam project from IIP to a wafer using the embodiment of FIG. 3.

To demonstrate the system 150, computer simulations with electron ray-tracing methods exhibit the projection optics from IIP 102 to wafer 107 in FIG. 4. The optical conditions for the simulation are 30 keV column beam energy, 1 keV landing energy, 1.5 kV/mm extraction field charged by CCP voltage, and approximately 100 kV accelerating voltage $V_a$ for both accelerating and focusing the beamlets on wafer 107.

The optical demagnification of the multi-beam image-formation through electron ray-tracing in FIG. 4 is approximately 8×, at which the off-axis performance of the multi-beam (coma, field curvature, astigmatism, distortion, and transfer chromatic aberration) are all minimized. The multi-beam field of view (FOV) at the wafer will be Di=250 μm if the FOV of the micro aperture array and micro lens array is $D_o$=2000 μm. A $D_o$ of 2000 μm can enable integration of hundreds of micro lenses for splitting hundreds of beamlets. A $D_i$ of 250 μm can enable collection of secondary electron beamlets from wafer to detector while controlling cross-talk between secondary electron beamlets.

FIG. 4 further shows that the crossover (xo) is around the accelerating electrode, which provides high crossover beam energy ($BE_{xo}=BE+V_a$). The crossover is pushed proximate to the wafer, giving fairly short image distance f. The crossover beam energy can be selected to reduce Coulomb interaction effects.

While disclosed with respect to FIG. 3, a similar crossover as illustrated in FIG. 4 can occur in the embodiment of FIG. 1.

FIG. 5 shows the primary electron beam resolution performance with the system 150. Compared to the previous designs, the multi-beam projection optics with a pure electrostatic objective lens in FIG. 4 improves the resolution.

Figure 6:
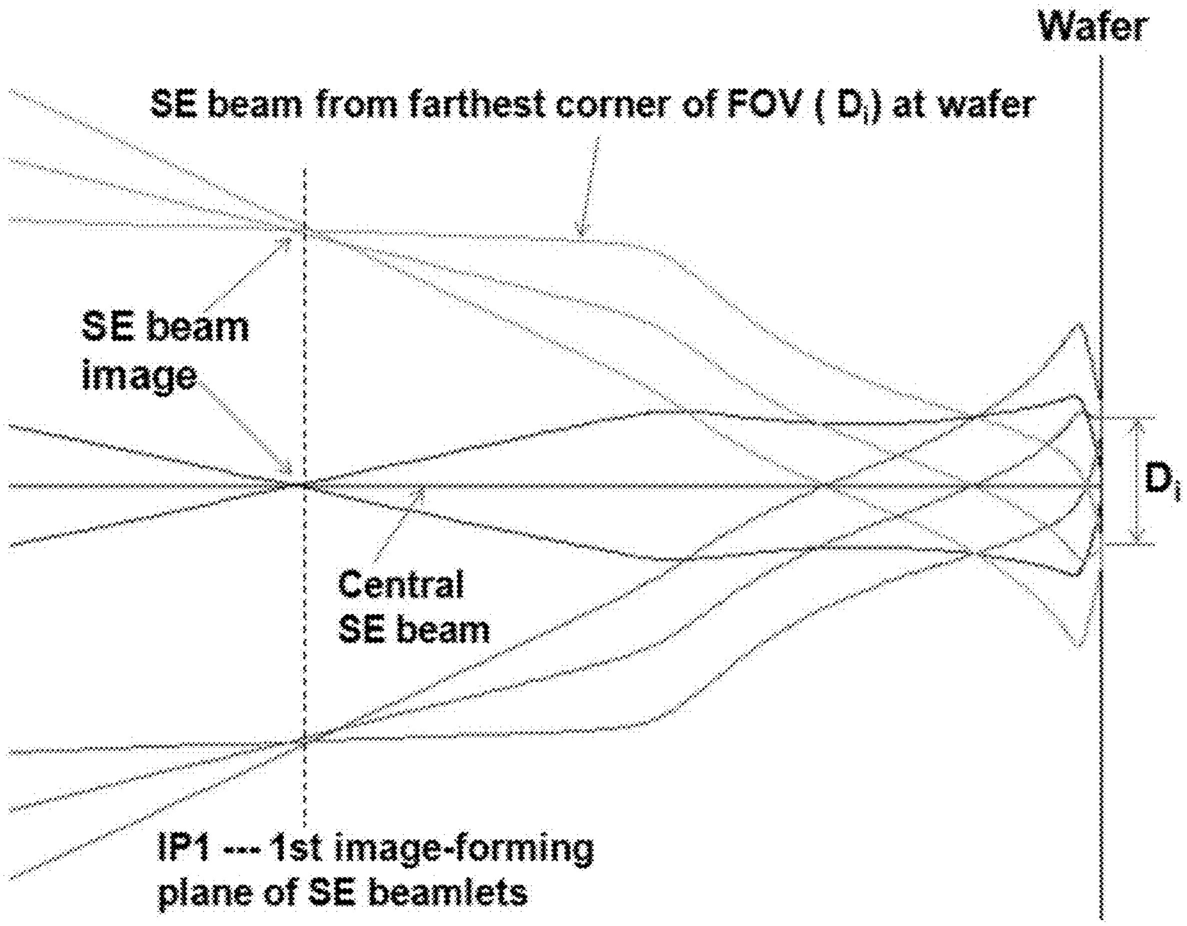
FIG. 6 shows secondary electron beamlet ray-tracing with the image-forming relation from the wafer to the first image plane.

FIG. 6 shows the simulations of secondary electron (SE) beamlet ray-tracing from wafer to first image-plane. Due to bombardment of the primary beamlet electrons on wafer, the secondary electrons from the array where the primary electrons are bombarding are image-formed by the electrostatic accelerating objective lens in FIG. 3. The optical magnification from wafer to the first image plane may be from approximately 3× to 5× in FIG. 6, depending on landing energies.

Most or all the secondary electron beamlets are deflected by the Wien filter and directed to the detector (e.g., approximately 70-80%). There may be a secondary electron projection optics in between the Wien filter and detector for imaging the objects in the first image plane onto the detector (i.e., the final secondary electron image plane). Such a secondary electron projection optics may represent functions of adjusting magnification, rotation, distortion correction, de-scanning, or other variables for the secondary electron beamlet array to meet the collecting requirements of the detector.

Some extremely large polar angle secondary electrons from one beamlet may "cross-talk" to another beamlet. A space-filtering aperture in the secondary electron optics can be used to filter out large angle secondary electrons and to reduce or eliminate cross-talk.

Figure 7:
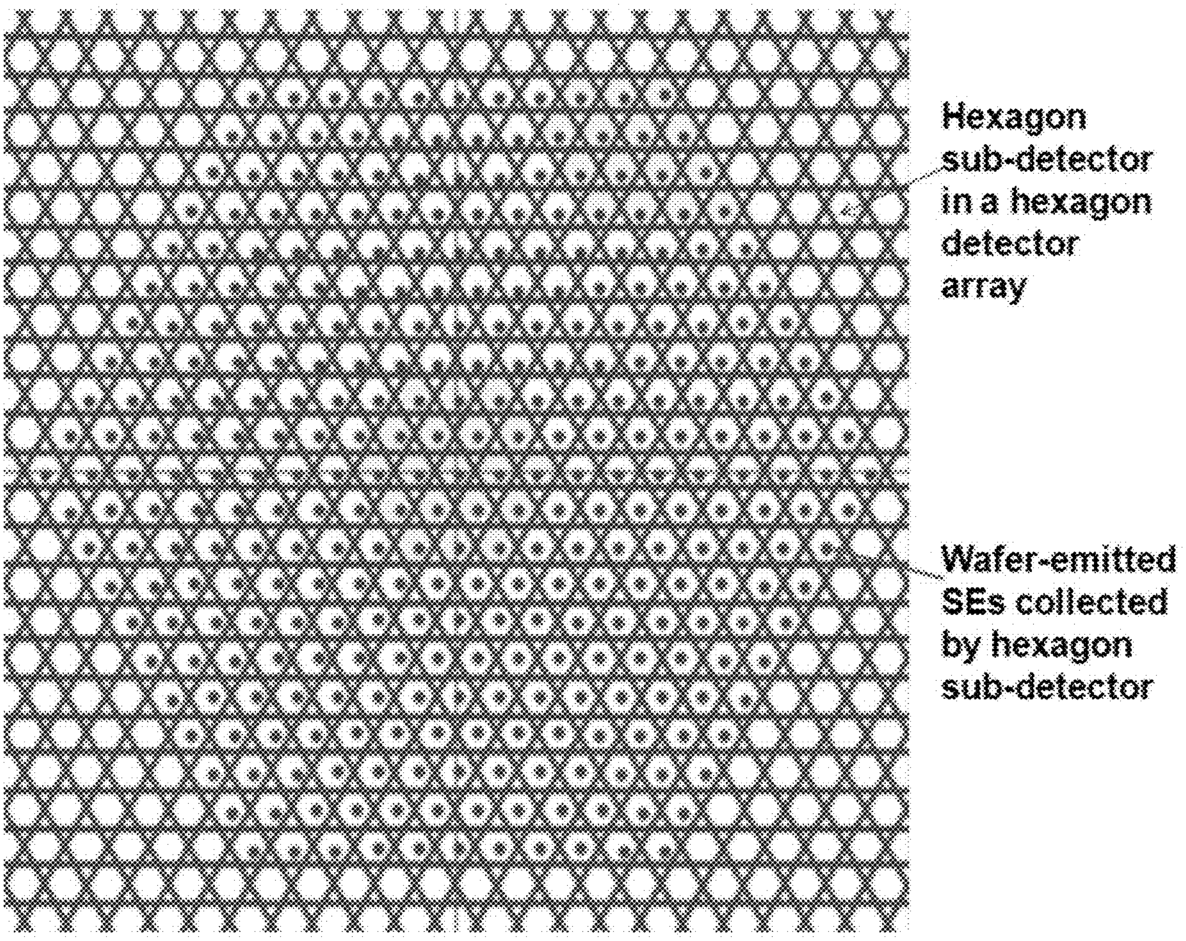
FIG. 7 is an exemplary hexagon detector array for collecting the secondary electron beamlets.

FIG. 7 show a hexagon detector array for collecting the secondary electron beamlets. Each independent sub-detector is a hexagon-shaped detector (e.g., a scintillation detector). One sub-detector can collect one secondary electron beamlet, as shown in FIG. 7.

With an accelerating magnetic objective lens scheme in FIG. 1, the resolutions of multi-electron beamlets may be improved with increasing the accelerating voltage $V_a$. The accelerating voltage $V_a$ may be increased, while avoid arcing and assuming the electron beamlets are stably focused on wafer with magnetic excitations.

Figure 8:
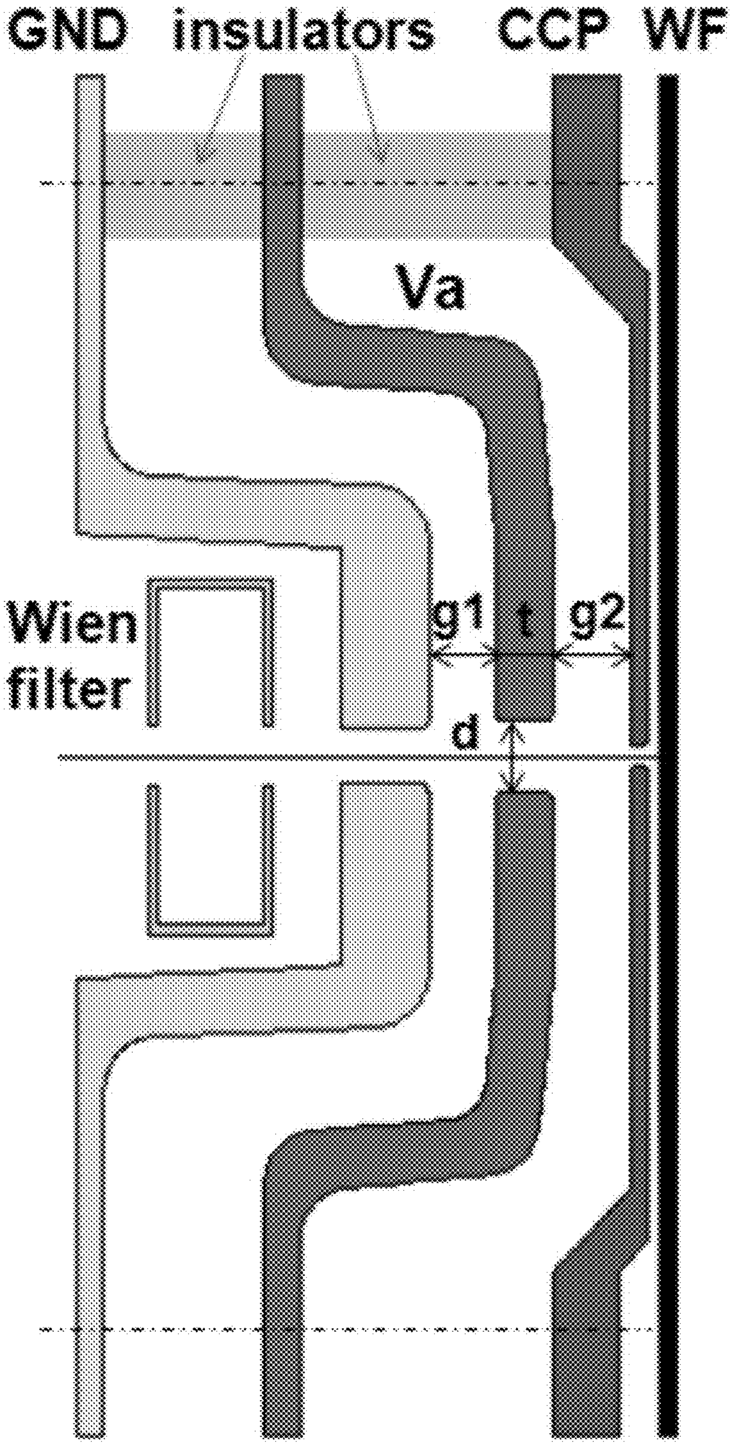
FIG. 8 is a cross-sectional view of an embodiment of an accelerating electrostatic objective lens in FIG. 3.

With an accelerating electrostatic objective lens scheme in FIG. 3 and FIG. 8, the resolutions of multi-electron beamlets are improved with an accelerating voltage $V_a$, at which the multi-electron beamlets are focused on the wafer. The magnetic section of the objective lens is removed in FIG. 3.

Without the commonly-used magnetic section in the objective lens in FIG. 3 and FIG. 8, the rotation of the secondary electron beamlet array is removed, making the secondary electron projection optics simpler, potentially without a need to correct secondary electron beamlet rotations.

FIG. 8 shows the embodiment of practical construction for an accelerating electrostatic objective lens in FIG. 3. The embodiment of FIG. 8 can accommodate and run high beam energies (e.g., approximately 20 to 50 keV) and retard the high beam energies to certain landing energies (e.g., approximately 0.1 to 50 keV). The embodiment of FIG. 8 can charge up the wafer through the CCP voltages with various extraction fields on wafer surface. The embodiment of FIG. 8 also can accelerate all the beamlets with sufficiently-high crossover beam energies through the acceleration voltage $V_a$, and then focus them on wafer with fairly short focus length (or image distance) f. The acceleration voltage $V_a$ may be greater than 75 kV in an instance.

The design in FIG. 8 can be arcing-free by selecting and designing proper gaps of g1 and g2, the thickness t, and diameter d of the acceleration electrode. For example, g1>15 mm, g2>20 mm, t>12 mm and d>15 mm.

In an embodiment, g1 is from approximately 15 mm to 20 mm, g2 is from approximately 20 mm to 25 mm, t is from approximately 12 mm to 16 mm, and d is from approximately 15 mm to 25 mm for typical uses with beam energy from approximately 30 kV to 50 kV and landing energy from approximately 0.1 keV to 30 keV. According to the requirements of the optics design (e.g., beam energy, landing energy, extracting field, etc.), the dimensions may be optimized and/or minimized to move the $V_a$ electrode as close to the wafer as possible to reduce the image distance for spot size. This is shown using Equation 3.

The embodiment of FIG. 8 can extract secondary electron beamlets from the wafer with immediate acceleration and focus, and can image-form these secondary electron beamlets on the first secondary electron image plane for the secondary electron collection in the detector array through a secondary electron projection optics.

The ground electrode, acceleration electrode, and charge control plate may be designed like recessed disks for increasing the outer gap distances in FIG. 8. Two insulators between the ground electrode, acceleration electrode, and charge control plate can connect and align these electrodes together. The inner and outer surfaces of the insulators can be designed in curve shapes, wave shapes, or other shapes to increase the surface distance or reduce the tangential electrical strength between the electrodes. The recessed disks of electrodes may be smoothly-curve-designed with high polishes to avoid arcing.

The gap between the charge control plate and wafer is normally referred to as working distance (WD) of an objective lens. The working distance may be variably designed through a z-height stage for meeting various uses of landing energies. The working distance can be from approximately 1 mm to 3 mm depending on the landing energy used. The higher the landing energy, the larger the working distance may be to avoid over-high focusing voltage $V_a$. Under an acceptable focusing voltage $V_a$, the working distance may be as small as possible to decrease spherical aberration and image distance.

Figure 9:
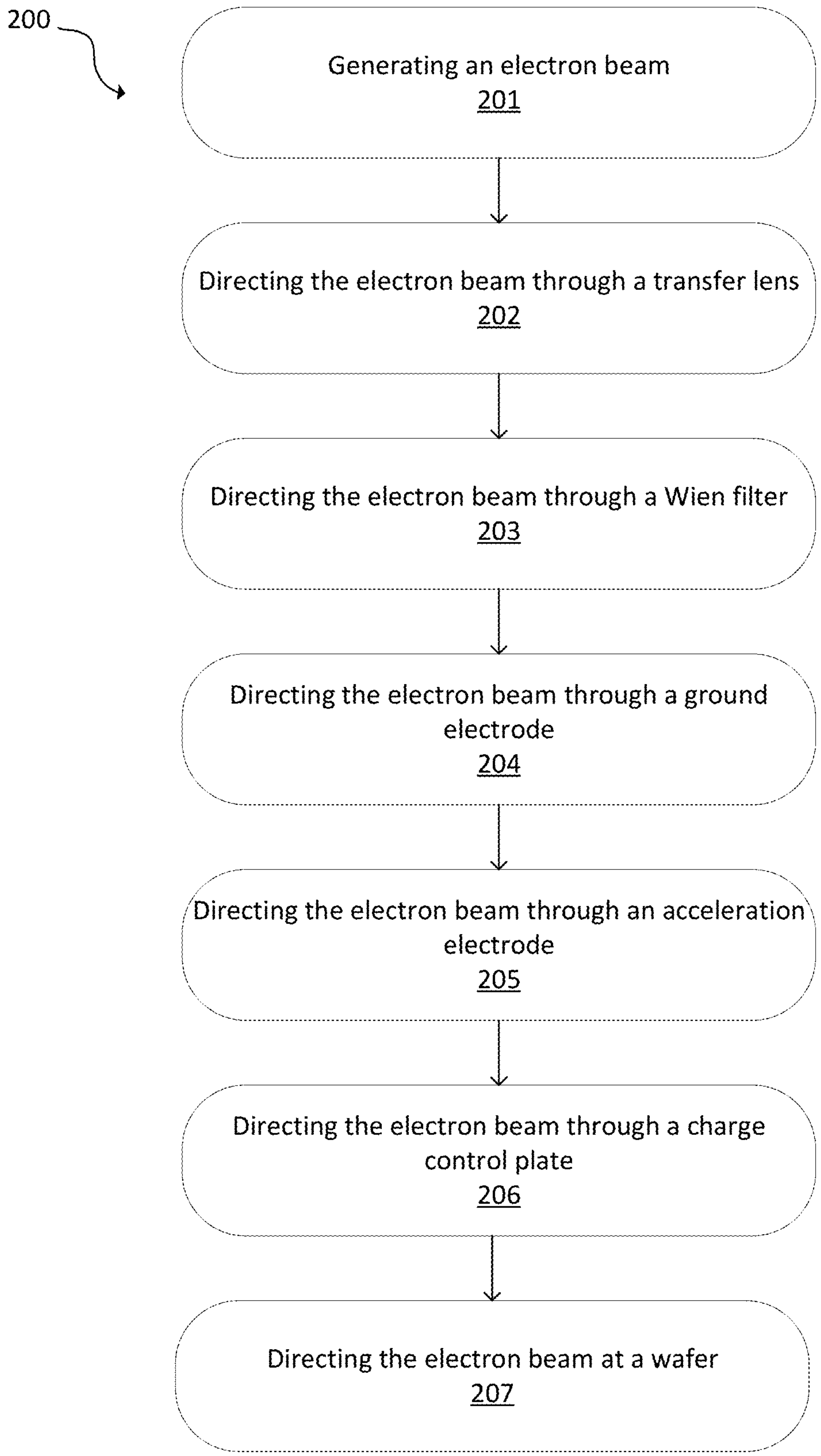
FIG. 9 is an embodiment of a method in accordance with the present disclosure.

FIG. 9 is an embodiment of a method 200, which can correspond to the operation of FIG. 1 or FIG. 3. An electron beam is generated at 201. The electron beam is directed through a transfer lens positioned downstream of an intermediate image plane at 202. The electron beam is directed through a Wien filter positioned downstream of the transfer lens at 203. The electron beam is directed through a ground electrode positioned downstream of the Wien filter at 204. The electron beam is directed through an acceleration electrode disposed downstream of the ground electrode at 205. The electron beam is directed through a charge control plate positioned downstream of the acceleration electrode at 206. The electron beam is directed at a wafer on a stage positioned downstream of the charge control plate at 207.

An acceleration voltage applied to the acceleration electrode can be configured to increase a beam energy around a beam crossover.

The method 200 can further include directing the electron beam through an objective lens positioned downstream of the transfer lens, such as that shown in FIG. 1. The objective lens can include an upper pole piece more proximate the transfer lens and a lower pole piece more proximate the stage. The upper pole piece can define a first aperture that the electron beam is directed through. The second pole piece can define a second aperture that the electron beam is directed through. The charge control plate can be disposed in the second aperture and the ground electrode can be disposed in the first aperture. The objective lens can be configured to focus the electron beam on the wafer. The electron beam can be directed through a crossover, which is posted at an image distance from the objective lens.

The crossover blur due to Coulomb interactions between electrons can affect a multi-electron beam apparatus in which all the electron beamlets are split from a single electron source. The blur of Coulomb interactions may be related to the crossover properties. These crossover properties can include, for example, the crossover angle, crossover beam energy, total beam currents through the crossover, and the crossover position, which is demonstrated in Equations 2 and 3. The crossover position may be equivalent to the image distance of the objective lens.

In the accelerating magnetic objective lens of FIG. 1, the blur of Coulomb interactions between electrons can be reduced while increasing the accelerating voltage $V_a$. The accelerating electrostatic objective lens of FIGS. 3 and 8 can include the functions of the lens in image-forming the multi-electron beams with improved optical performance (e.g., beamlet resolutions). A pure electrostatic accelerating objective lens can extract secondary elections and image-form them in the first image plane of the secondary electron beamlets (FIG. 6). Through a secondary electron projection optics, the secondary electrons in the first image plane can be projected onto the detector array (FIG. 7).

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

a transfer lens disposed in a path of an electron beam downstream of an intermediate image plane;

a stage disposed in the path of the electron beam, wherein the stage is configured to hold a wafer;

a Wien filter disposed in the path of the electron beam between the transfer lens and the stage;

a ground electrode disposed in the path of the electron beam between the Wien filter and the stage;

a charge control plate disposed in the path of the electron beam between the ground electrode and the stage;

an acceleration electrode disposed in the path of the electron beam between the ground electrode and the charge control plate;

an objective lens disposed in the path of the electron beam downstream of the transfer lens, wherein the objective lens includes an upper pole piece more proximate the transfer lens and a lower pole piece more proximate the stage, wherein the upper pole piece defines a first aperture that the electron beam is directed through, and wherein the second pole piece defines a second aperture that the electron beam is directed through, wherein the charge control plate is disposed in the second aperture, and wherein the ground electrode is disposed in the first aperture; and wherein the electron beam is configured to be directed through a crossover with a second electron beam, and wherein the crossover occurs at the acceleration electrode using the transfer lens.

2. The system of claim 1, wherein the objective lens is a magnetic objective lens.

3. The system of claim 1, wherein the objective lens is an electrostatic objective lens.

4. The system of claim 1, wherein the acceleration electrode is spaced from the ground electrode by a first distance and wherein the acceleration electrode is spaced from the charge control plate by a second distance, wherein the first distance is from 15 mm to 20 mm and the second distance is from approximately 20 mm to 25 mm.

5. The system of claim 1, wherein the acceleration electrode has a thickness from 12 mm to 16 mm in a direction of the path of the electron beam.

6. The system of claim 1, wherein the acceleration electrode defines a bore that the electron beam passes through, wherein the bore has a diameter from 15 mm to 25 mm.

7. The system of claim 1, further comprising a hexagon detector array.

8. A method comprising:

generating an electron beam;

directing the electron beam through a transfer lens positioned downstream of an intermediate image plane;

directing the electron beam through a Wien filter positioned downstream of the transfer lens;

directing the electron beam through an objective lens positioned downstream of the transfer lens, wherein the objective lens includes an upper pole piece more proximate the transfer lens and a lower pole piece more proximate the stage, wherein the upper pole piece defines a first aperture that the electron beam is directed through, and wherein the second pole piece defines a second aperture that the electron beam is directed through;

directing the electron beam through a ground electrode positioned downstream of the Wien filter;

directing the electron beam through an acceleration electrode disposed downstream of the ground electrode, wherein the electron beam is directed through a crossover with a second electron beam, and wherein the crossover occurs at the acceleration electrode using the transfer lens;

directing the electron beam through a charge control plate positioned downstream of the acceleration electrode; and directing the electron beam at a wafer on a stage positioned downstream of the charge control plate.

9. The method of claim 8, wherein the charge control plate is disposed in the second aperture and wherein the ground electrode is disposed in the first aperture.

10. The method of claim 8, wherein the objective lens is configured to focus the electron beam on the wafer.

11. The method of claim 8, further comprising selecting a location for a principal plane of the objective lens relative to the wafer to increase resolution.

12. The method of claim 8, wherein an acceleration voltage applied to the acceleration electrode is configured to increase a beam energy around a beam crossover.

13. The method of claim 8, further comprising selecting a crossover beam energy for the electron beam configured to reduce Coulomb interaction effects.

* * * * *